US006691263B2

(12) United States Patent
Vasic et al.

(10) Patent No.: US 6,691,263 B2
(45) Date of Patent: Feb. 10, 2004

(54) INTERATIVE DECODING BASED ON DOMINANT ERROR EVENTS

(75) Inventors: Bane V. Vasic, Tucson, AZ (US); Jeffrey L. Sonntag, Portland, OR (US); Inkyu Lee, Kearny, NJ (US)

(73) Assignee: Agere Systems Inc., Allentown, PA (US)

( * ) Notice: Subject to any disclaimer, the term of this patent is extended or adjusted under 35 U.S.C. 154(b) by 424 days.

(21) Appl. No.: 09/847,953

(22) Filed: May 3, 2001

(65) Prior Publication Data

US 2003/0033574 A1 Feb. 13, 2003

(51) Int. Cl.$^7$ .................. H03M 13/41; H03M 13/01; H03M 13/13; H03M 13/25
(52) U.S. Cl. .................. 714/709; 714/780; 714/794
(58) Field of Search .................. 714/709, 780, 714/794

(56) References Cited

U.S. PATENT DOCUMENTS

| | | | | |
|---|---|---|---|---|
| 5,537,444 | A | * | 7/1996 | Nill et al. .................. 714/794 |
| 6,421,804 | B1 | * | 7/2002 | Lee .................. 714/780 |
| 6,581,182 | B1 | * | 6/2003 | Lee .................. 714/795 |
| 6,587,987 | B1 | * | 7/2003 | Vasic et al. .................. 714/780 |
| 6,594,792 | B1 | * | 7/2003 | Hladik et al. .................. 714/794 |
| 6,615,385 | B1 | * | 9/2003 | Kim et al. .................. 714/794 |
| 2002/0129318 | A1 | * | 9/2002 | Campello De Souza et al. .................. 714/795 |
| 2003/0056166 | A1 | * | 3/2003 | Kim et al. .................. 714/795 |

OTHER PUBLICATIONS

W. Xu et al., "Joint Source–Channel Decoding Using The Residual Redundancy in Compressed Images", IEEE International Conference On Communications (ICC), vol. 1, 23, Jun. 23, 1996, p. 142–148.*

(List continued on next page.)

Primary Examiner—R. Stephen Dildine
(74) Attorney, Agent, or Firm—Steve Mendelsohn; Ian M. Hughes (57) ABSTRACT

An iterative decoding system for intersymbol interference (ISI) channels has a module for extracting bit reliabilities from a partial response (PR) channel, an iterative decoder, and a module for updating the bit reliabilities. A transmitter parses a data sequence into blocks that are encoded to generate a sequence of codewords. By encoding, a correlation among the bits of each codeword output to the PR channel is created. A maximum likelihood sequence detector (MLSD) in the receiver produces estimates of transmitted bits from samples of the output from the PR channel. The MLSD detector has a priori knowledge of typical error events that can occur during transmission through the channel. Along with the bit estimates, at each time instant the MLSD detector generates set of error event likelihoods. These error event likelihoods are then converted into bit reliabilities that, together with estimates for the transmitted bits, are used to recalculate the bit reliabilities using the knowledge of the relation between bits within a codeword. The iterative decoder uses this soft input information (bit reliabilities and bit estimates) for each iteration of decoding to improve i) the estimate of the bit reliabilities, ii) the decisions of what bit has been transmitted, and iii) calculations for the error event likelihoods for the next iteration. These error event likelihoods are then converted into bit reliabilities that, together with estimates for the transmitted bits, are used by the iterative decoder to recalculate the bit reliabilities using the knowledge of correlation among bits within the codeword. The error event likelihoods may be updated using the updated bit reliabilities, and the updated error event likelihoods are then converted to new bit reliabilities for the next iteration. In an iterative manner, increasing those bit reliabilities that tend to show increasing confidence for corresponding decoded bits (i.e., corresponding Viterbi decisions) between iterations, while decreasing those reliabilities that tend to show decreasing confidence for corresponding decoded bits, tends to drive the iterative decoding scheme to fewer iterations while maintaining a predetermined probability of error.

24 Claims, 4 Drawing Sheets

OTHER PUBLICATIONS

"Error Control Coding, Fundamentals and Applications," by S. Lin and D. Costello, Jr., pps. 1–14, Prentice Hall, 1983.

"Maximum Likelihood Sequence Estimators: A Geometric View" by L. Barbosa, IEEE Trans. on Inform. Theory, vol. 35, No. 2, pp. 241–247, Jan. 1999.

"Error–Event Characterization on Partial–Response Channels" by Shirish A. Altekar, et al., IEEE Trans. on Inform. Theory, vol. 45, No. 1, pp. 241–247, Jan. 1999.

"Application of Partial Response Channel Coding to Magnetic Recording Systems" by H. Kobayashi and D. Tang, IMB J. Res. and Dev., vol. 14, pp. 368–375, Jul. 1979.

"Finite–State Modulation Codes for Data Storage" by Brian H. Marcus, et al., IEEE Journal on Select. Areas in Commun. , vol. 10, No. 1, pp. 5–37, Jan. 1992.

* cited by examiner

INTERATIVE DECODING BASED ON DOMINANT ERROR EVENTS

BACKGROUND OF THE INVENTION

1. Field of the Invention

The present invention relates to decoding in a communications receiver, and, more particularly, to iterative decoders generating reliability information.

2. Description of the Related Art

Digital transmission and recording systems convey discrete-time data sequences across channels using analog signals that vary as they pass through different channel media (e.g., wireless channels or magnetic/optical recording media). A primary goal of any such system is to convey information at the fastest possible rate with a minimum number of errors. Accordingly, numerous approaches for error control have been developed to try to minimize and/or correct errors in transmitted signals, as illustrated in U.S. Pat. No. 6,029,264 to Kobayashi et al. and "Error Control Coding, Fundamentals and Applications," by S. Lin and D. Costello, Jr., Pages 1–14, Prentice Hall, 1983, both of which are incorporated herein fully by reference.

A data sequence may be defined as comprising, for example, a series of bits represented as analog pulses. The analog pulses either change in amplitude or remain unchanged for each corresponding bit interval, and may either represent the bit itself by an amplitude or represent transitions between bits (e.g., one amplitude represents a transition from "0" to "1", while a different amplitude may represent a transition from "1" to "0"). The data sequence is thus transmitted as a sequence of analog pulses, each with duration (interval) T. The analog pulse is filtered to select a pulse shape that is optimal in some manner for detection (e.g., via square-root raised cosine filtering). A receiver attempts to reconstruct the data sequence from the received sequence of analog pulses.

Despite the somewhat imprecise correlation between the original data sequence and the transmitted data sequence ultimately input to a receiver, the different pulses may be distinguishable from each other by a detector using a well-known technique referred to as "sequence detection. In contrast to detecting a present, or current, bit as a decision based solely on a sampled, received pulse, sequence detection examines a sequence of samples over several received pulses to detect a present bit. Even if the signal is corrupted by noise, the detection of each bit is accomplished by i) sampling at the bit interval T and ii) storing the sample value of each pulse at the sample point. The bit being sampled at time n is referred to herein as the "present sample" or "present bit" P(n). By comparing the value of the present sample with the value of the samples immediately preceding the present sample in the data sequence it can be determined if a change in amplitude has occurred. The samples immediately preceding the present sample P(n) are the samples taken at time P(n−1), P(n−2), P(n−3), . . . , P(n−M+1), where M is the channel memory. Channel memory M may be considered to be the number of previous samples that influence the present sample. When the present sample is processed, compared, or otherwise under scrutiny, it is also known as the "bit of interest."

Although sequence detection offers a reasonable method of error control, increasing the overall data rate may cause received pulses to overlap. Pulses may overlap at the point of transmission as each symbol period decreases. Pulses may also overlap due to the channel effect known as dispersion. Since the pulses representing the transmitted bits overlap, the combined pulse, obtained by superposition of the overlapping pulses, results in a signal in which the first pulse and the second pulse are less easily distinguished from one another. This effect is known as inter-symbol interference (ISI). At a receiver, the present sample contains not only the amplitude contribution of the pulse for the bit of interest but also includes the amplitude contribution of the "tail" of one or more previous pulses.

A sequence detector is employed to detect and identify transmitted (or, in the case of magnetic recording systems, recorded) sequences of pulses that are more likely to be incorrectly transmitted, using a priori knowledge of noise characteristics and impulse response of the channel. For example, a sequence detector may use a priori knowledge of the dependence of noise samples on previous noise samples, noise power, and/or partial response polynomials representative of the channel. A common noise model is called Additive White Gaussian Noise (AWGN), and a common channel model is the linear time-invariant channel with memory. In addition, if the pulses have short tails, ISI in the bit of interest is limited to a small number of previous samples, since after some time interval a previous pulse will have little or no effect on the value of the present sample. For typical implementations of sequence detectors, it is desirable that the samples of the signal tail be limited to a small, finite number of integer values to reduce the number of comparisons that must be made. Systems utilizing this property are called "partial response" (PR) systems, and the number of previous samples effecting the pulse of the bit of interest is generally known as the channel memory length.

A maximum-likelihood sequence detector (MLSD) is a sequence detector known in the art and used for an uncoded, linear channel with ISI and AWGN. An MLSD detector comprises a whitened, matched filter (WMF), having an output that is sampled at the Nyquist rate of the input signal, and a Viterbi detector employing a version of the well-known Viterbi algorithm (VA). The sampled output of the WMF is input to the Viterbi detector. The trellis structure of the VA algorithm includes i) a sequence of states and ii) a set of paths through the trellis. The state of the trellis is defined by the ideal values for received bits, and each state typically corresponds to a presently received bit and one or more previously received bits with the number of previously received bits generally equivalent to the length of the channel memory. A path through the trellis is termed an output sequence and defines a sequence of transitions between the states through the trellis, with each path corresponding to a block of possible, or allowed, bits.

The trellis of the VA algorithm describes all possible data sequences that can occur at the output of the channel as a result of the input sequence. A particular path through the trellis is determined from the input samples and reflects the maximum-likelihood data sequence transmitted through the ISI channel. The particular path is determined by comparing the likelihood of traversing each of the paths through the trellis given the input samples. A metric, such as minimum Euclidean distance, between the received samples and ideal symbol values is calculated for each state transition to derive a quantity that reflects a likelihood or transition probability for the input sample making the particular transition to the state (sometimes termed a branch metric). Comparing the likelihood of traversing each of the paths is accomplished by comparing the sum of the branch metrics (sometimes termed the path metric) of each path to determine the path exhibiting the maximum likelihood of occurrence given the input samples. These prior art MLSD detectors are generally not practical, particularly for communication and recording systems. The MLSD detectors are generally not practical because the structure of the MLSD is prohibitively complex to implement when the VA algorithm requires a large number of states in the trellis (i.e., the hardware required to implement all the calculations and comparisons is very complex).

Many PR systems utilize equalization to reduce the residual ISI-caused errors of mis-detection, and possibly reduce the number of states in the trellis used by the VA algorithm. Equalization may typically include amplification of the received signal by an amplifier that has a frequency response based on an estimate of the channel's frequency response. In some PR systems, a data sequence is reconstructed from the received signal after equalization using the Viterbi detector. The noiseless equalizer output sample resulting from the use of this approach is affected by only a finite number of previous input (transmitted or recorded) samples; thus, the set of equalizer output values has fixed boundaries.

The well-known Viterbi algorithm employed by a Viterbi detector is relatively simple and the optimum choice for use in an uncoded communication system where soft-output (i.e., a soft decision for a sample and relative reliability of the decision, or other form of reliability-checking) is not required. However, in many applications, the data transmitted over channels is encoded to improve the overall error performance of the system. Soft-output is generated in two common systems. One common system is a concatenated encoding system having a pair of codes (an inner code and an outer code) in which the soft output from decoding of the inner code is employed to improve the performance of the outer code. Another common system is an iterative decoding system in which a decoder "purifies" its decisions about certain code symbols through repeating a series of operations performed on a whole codeword (i.e., after each iteration there are fewer errors in the code word).

One of the most common algorithms for sequence detection with soft output is Hagenauer's soft-output-Viterbi-algorithm (SOVA) used in concatenated encoding with an outer code, such as a Reed-Solomon code. The soft output at a particular time instant, produced by the SOVA algorithm, is determined on the basis of the Euclidean distance between the two "best" paths through a trellis that merge to the same state. This merging of states is based on the well-known concept of the "channel trellis" described for MLSD detectors. Two paths are considered merged when the paths converge at some state in the trellis and follow the same sequence of states through the remainder of the trellis.

The merged paths are then compared and a smaller level of reliability (i.e., a lower level of confidence in the accuracy of the data sequence being considered) is assigned to bits that do not agree. The procedure is repeated for all channel (or trellis) states. The VA algorithm's decision for a particular bit in a sequence together with the bit's reliability level is referred to as soft output or soft information. According to the SOVA algorithm of the prior art, the comparison is performed for all possible merged path pairs, and for all states. An equivalent comparison defines and compares all possible error event sequences to determine the sequence of bits and corresponding levels of reliability.

A data sequence $\{a^{(k)}\}$ is encoded into a sequence $\{d^{(k)}\}$ in such a way that sequence $\{a^{(k)}\}$ can be uniquely reconstructed from sequence $\{d^{(k)}\}$ to minimize transmission errors, for example, by adding parity bits as an outer code. As used herein, the notation $\{a^{(k)}\}$, for example, is used to indicate a sequence a of sample values or bits considered up to discrete time k (i.e., $\{a^{(k)}\}$ is the sequence a(k,), a(k−1), a(k−2), . . . , a(k−L)). Using control codes, sequence $\{a^{(k)}\}$ may be reconstructed even when some symbols of the encoded sequence $\{d^{(k)}\}$ are corrupted by errors during the transmission of the signal. The Viterbi detector generates a sequence of bit estimates $x^{(k)}$ for the sequence $\{d^{(k)}\}$ from an input sample sequence $\{r^{(k)}\}$. Typically, encoding is performed on a block by block basis, so the decoder will use a corresponding portion (block) of the sequence of bit estimates $x^{(k)}$ output from the Viterbi detector, as well as knowledge of the bit reliabilities of the bit estimates $x^{(k)}$, to decode and error correct. When decoding on a block by block basis, some Viterbi detectors use a trellis that accounts for overlap of samples between blocks. The Viterbi estimate $x^{(k)}$ together with its reliability is generally termed a soft decision.

Due to noise and other disturbances, the block of estimates $\{x^{(k)}\}$ of the transmitted stream and the transmitted stream itself $\{d^{(k)}\}$ may differ. Their difference is termed an error sequence $\{\epsilon^{(k)}\}$, where $\{\epsilon^{(k)}\}=(x^{(k)}-d^{(k)})$. For good channels that add low noise power and introduce a small number of errors, the error sequence contains a zero in almost each element position, but when the error sequence is nonzero, some error patterns occur much more often than others do. Although any error sequence is possible, these more frequent error patterns tend to dominate overall system performance (e.g., bit error rate (BER)). A recognition and explanation of the phenomenon of recurring error sequences, which is inherent for all PR systems, may be found in "Maximum Likelihood Sequence Estimators: a Geometric View" by L. Barbosa, IEEE Trans. Inform. Theory, vol. 35, pp. 419–427, March 1989, incorporated fully herein by reference.

The Euclidean distance from channel output sequences corresponding to a sequence $\{d^{(k)}\}$, to the channel output sequence corresponding to $\{d^{(k)}-\epsilon^{(k)}\}$, where $\{\epsilon^{(k)}\}$ is a sequence of one of the dominant (more frequently occurring) error patterns, is always smaller than the distance to any other error sequence. Consequently, the Viterbi detector (which in fact uses Euclidean distance as a metric) confuses sequences that produce the dominant error pattern. Consequently, error sequences causing dominant error patterns are also called minimum distance error event sequences.

A method of finding dominant error event sequences is described in "Error-Event Characterization on Partial-Response Channels" by S. Altekar. M. Berggren, B. Moision, P. Siegel, and J. Wolf, IEEE Trans. Inform. Theory, vol. 45, no. 1, pp. 241–247, January 1999, incorporated fully herein by reference. In recording systems, for a given partial response polynomial, the set of dominant error event sequences depends also on the channel bit density (e.g., the number of pulses transmitted per bit interval) because of noise coloration from equalization. Other methods for determining dominant error event sequences are also known and described in, for example, "Application of Partial Response Channel Coding to Magnetic Recording Systems" by H. Kobayashi and D. Tang, IBM J. Res. And Dev., vol. 14, pp. 368–375, July 1979 and "Finite-state Modulation Codes for Data Storage" by B. Marcus, P. Siegel, and J. Wolf, IEEE Journal on Select. Areas in Cornmun., vol. 10, no. 1, pp5–37, January 1992, both of which are incorporated herein by reference. However, these, prior art systems require that previous samples in a data sequence as well as future samples be considered when evaluating the accuracy of the present sample. This results in a slow and complex procedure that requires considerable system memory to store each and every sample and considerable delay from processing required to generate each decision.

SUMMARY OF THE INVENTION

The present invention relates to an iterative decoding system for partial response (PR) channels having inter-symbol interference (ISI) that i) extracts error event likelihoods that are converted to bit reliabilities for estimates from a data sequence transmitted through the PR channel, ii) recalculates the bit reliabilities during a decoding iteration, and iii) updates the error event likelihoods. Updated error event likelihoods are subsequently converted to new bit reliabilities for the next iteration. The estimates correspond to a data sequence having a correlation among the bits of the sequence, and the iterative decoding system has a priori knowledge of typical error events that may occur when generating estimates from the data sequence by, for example, Viterbi detection. For the first iteration of decoding, error event likelihoods are generated from the estimates, received samples corresponding to the estimates, and the a priori knowledge of typical error events. These error event likelihoods are converted into bit reliabilities that, together with estimates for the transmitted bits, are subsequently used by the iterative decoder to decode the estimates. After decoding, the bit estimates are recalculated using the knowledge of the relation between bits of the sequence. The bit reliabilities may then be modified for a subsequent iteration of decoding by increasing those bit reliabilities that tend to show increasing confidence for corresponding decoded bits (i.e., corresponding Viterbi decisions) between iterations, while decreasing those reliabilities that tend to show decreasing confidence for corresponding decoded bits. This modification may be achieved through updating the error event likelihoods using the recalculated bit reliabilities. Such improvements tend to drive the iterative decoding scheme to fewer iterations while maintaining a predetermined probability of error.

In accordance with an exemplary embodiment of the present invention, a sample sequence representing encoded data and filtered by a channel polynomial is iteratively decoded by generating bit estimates for the sample sequence corresponding to the encoded data and extracting error event likelihoods for the bit estimates based on i) the sample sequence, ii) the bit estimates, and iii) an error event list. During a first iteration, the bit estimates are decoded by (1) converting the error event likelihoods into bit reliabilities, (2) decoding the bit estimates into decoded data based on the bit reliabilities, and (3) updating the bit reliabilities based on the decoded data, During a subsequent iteration, the bit estimates are decoded by (1) updating the error event likelihoods based on the updated bit reliabilities; (2) converting the updated error event likelihoods to new bit reliabilities, and (3) decoding the bit estimates into newly decoded data based on the new bit reliabilities.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

In accordance with the present invention, a low complexity iterative decoding system employs soft information generated by an iterative decoder for calculation of the error event likelihoods. The iterative decoding system comprises a maximum likelihood sequence detector (MLSD) having: a module that generates a sequence of estimates for received samples output from a partial response (PR) channel, a module that extracts corresponding bit reliabilities, an iterative decoder generating decoded data from the sequence of estimates and updated bit reliabilities, and a module that updates the error event likelihoods with the updated bit reliabilities after recalculation of the bit reliabilities during the iterative decoding process. Updating the error event likelihoods, which are subsequently converted to bit reliabilities for the next iteration, reflects increasing or decreasing confidence in decoded bits during the iterative decoding process.

The MLSD processor receives the signal from the channel and produces estimates of transmitted bits. The transmitted bits correspond to a data sequence parsed into blocks with each block encoded into a codeword. The encoding process introduces a known correlation among bits of the codeword that may be used for error detection and/or correction. The MLSD processor has a priori knowledge of typical error events that can occur when estimates are generated from received signal samples using a maximum likelihood sequence detection algorithm. The MLSD processor generates a corresponding set of error event likelihoods for the bit estimates based on the a priori knowledge of these error events. The error event likelihoods are then converted into bit reliabilities. The bit estimates and bit reliabilities, termed soft information, are used by the iterative decoder to decode the bit estimates to reconstruct the original data sequence. After the iteration, the decoder updates the bit reliabilities using the knowledge of the relation between bits within a codeword and the results of the error detection and correction process. Once updated, the MLSD processor updates the error event likelihoods using the updated bit reliabilities to reflect the increasing or decreasing confidence in decoded bits during the iterative decoding process. In a subsequent iteration of decoding, the updated error event likelihoods are converted to new bit reliabilities for the iteration.

For described embodiments, either linear block codes or convolutional codes are used, but one skilled in the art may extend the present invention to other types of encoded data sequences that may be iteratively decoded. In addition, while the described embodiments employ a Viterbi detector using the Viterbi algorithm within the MLSD processor, one skilled in the art may readily extend the teachings herein to other types of maximum likelihood detection algorithms.

Figure 1:
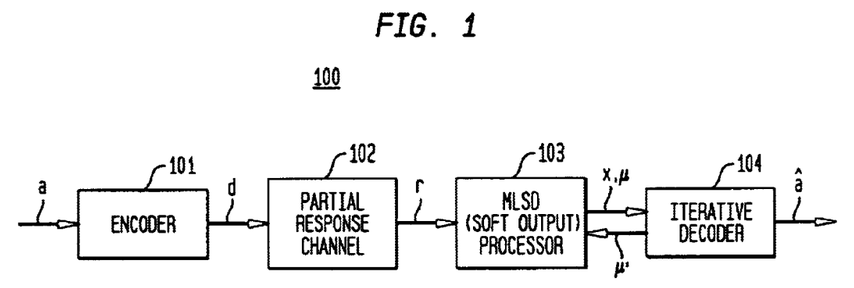
FIG. 1 shows a block diagram for a partial response (PR) channel system comprising an encoder, a PR channel, a maximum likelihood sequence detector (MLSD) processor, and an iterative decoder operating in accordance with exemplary embodiments of the present invention.

FIG. 1 shows a partial response (PR) channel system 100 comprising an encoder 101, PR channel 102, MLSD processor 103, and iterative decoder 104. FIG. 1 shows only a portion of the digital processing of the system, where the A/D converters, timing recovery, gain control, modulators, demodulators, filters, and other components are omitted for clarity. Encoder 101 is generally part of an RF transmitter or magnetic recording device, while PR channel 102 represents a PR channel with memory, such as a wireless channel or magnetic recording medium. MLSD processor 103 and iterative decoder 104 may generally be included in an RF receiver or magnetic recording playback system.

Encoder 101 may implement block encoding of a parsed data sequence into codewords. In particular, encoder 101 translates data sequence $a=\{a^{(k)}\}$ (k an integer), to a sequence $d=\{d^{(k)}\}$ in such a way that sequence a can be uniquely reconstructed from sequence d. For the described embodiment, the data sequence is binary (e.g., $a^{(k)} \in \{0,1\}$), but other formats may be used. Furthermore, sequence d is generated with an error control code, so it is possible to reconstruct sequence a even when some symbols of sequence d are corrupted. The sequence d is generated by parsing the data sequence a into distinct codewords or code blocks. Two important classes of error control codes are block codes and convolutional codes. Other types of coding, such as modulation encoding as is used in recording systems, may be used in addition to the error control coding. A modulation code may be used to improve clock recovery and automatic gain control, and such encoding with a modulation code would precede encoder 101 in FIG. 1.

After transmission through PR channel 102, the received signal is sampled (e.g., by a digital sampler not shown in the figures) to produce the sample sequence r that is provided to MLSD processor 103. MLSD processor 103 receives the output sample sequence r at a rate corresponding to the bit period of the transmitted codeword bits. MLSD processor 103 implements a maximum likelihood sequence detection algorithm, such as the Viterbi algorithm or Hagenauer's soft-output-Viterbi-algorithm (SOVA), to generate bit estimates for the transmitted bits as a sequence of decisions $x=\{x^{(k)}\}$. Iterative decoder 104 uses the sequence of decisions $x^{(k)}$ from MLSD processor 103 and a corresponding reliability value $\mu_x^{(k)}$ of the specific value of $x^{(k)}$ to decode, and possibly correct errors in, the sequence of decisions to reconstruct the data sequence $\{a^{(k)}\}$. An estimate $x^{(k)}$ (hard decision) together with its reliability value $\mu_x^{(k)}$ are collectively defined as soft information about the bit in sequence x at time k.

Figure 2:
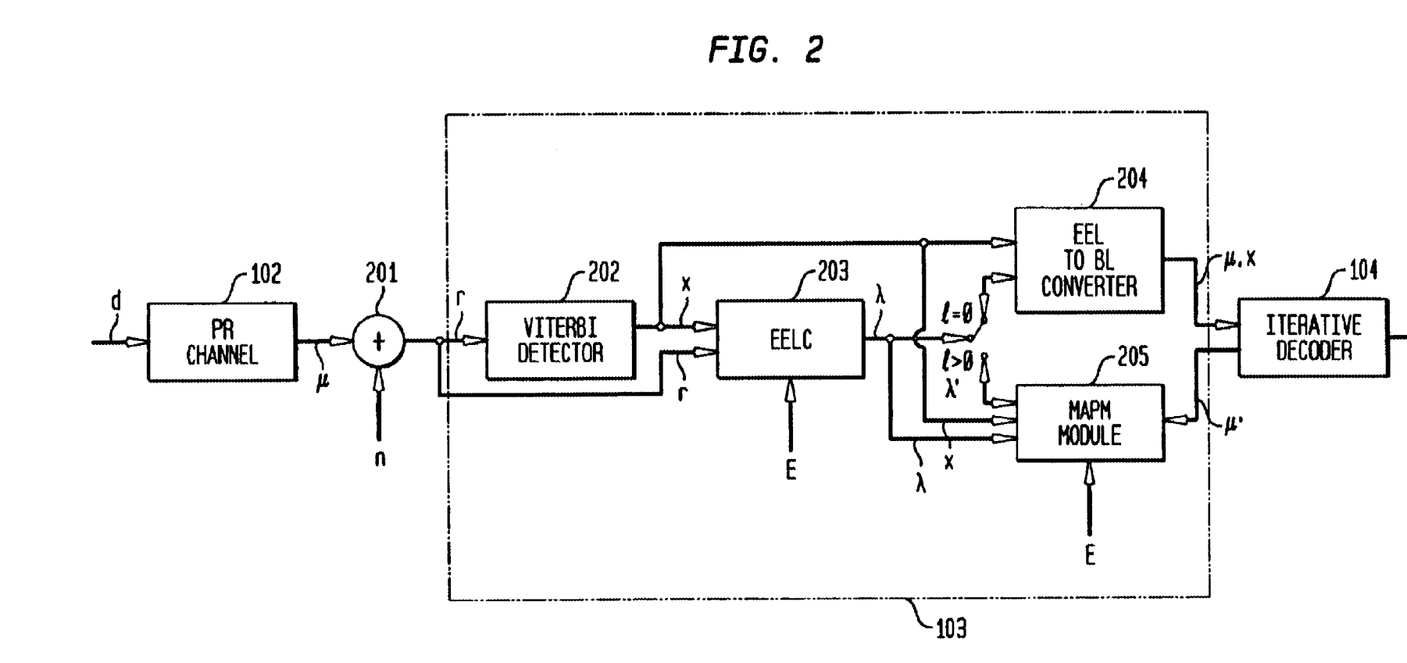
FIG. 2 shows a block diagram for an exemplary implementation of the MLSD processor and iterative decoder of FIG. 1.

FIG. 2 shows a block diagram of an exemplary implementation of MLSD processor 103 and iterative decoder 104 operating in accordance with embodiments of the present invention. MLSD processor 103 includes Viterbi detector 202, error event likelihood calculator (EELC) 203, error event likelihood to bit likelihood (EEL to BL) converter 204, and maximum a posteriori modification (MAPM) module 205. As described with respect to FIG. 1, the data sequence d is filtered by PR channel 102 and corrupted by noise n (shown symbolically in FIG. 2 as noise signal n added to filtered channel data u in combiner 201). The output sequence d from PR channel 102 (i.e., the output sequence without added noise) is u=h*d (where "*" denotes convolution), so at (discrete) time k the noiseless channel sample $u^{(k)}$ is given as in equation (1):

$$u^{(k)} = h^{(0)}d^{(k)} + h^{(1)}d^{(k-1)} + \ldots + h^{(L_n)}d^{(k-L_n)} \quad (1)$$

The polynomial $h(D)=h^{(0)}+h^{(1)}D+ \ldots +h^{(L_n)}D^{(L_n)}$, where D represents the delay operator, is the polynomial characterizing the PR channel (termed the PR polynomial), $L_n$ is the order of the PR polynomial (also known as the channel memory), and the vector h is a vector of coefficients of the polynomial h(D). Thus, the sequence $u^{(k)}$ includes effects from a finite number of previous samples.

Viterbi detector 202 produces the sequence $x^{(k)}$ of bit (or symbol) decisions that is termed a "maximum likelihood estimate" of the received data sequence. If the noise n added to the signal u from PR channel 102 is additive white Gaussian noise (AWGN), and the sequence $x^{(k)}$ of bit decisions is convolved with the PR polynomial to generate the sequence v (i.e., $v=x^{(k)}*h$), then the sequence v has minimal Euclidean distance from received sample sequence r that is input to Viterbi detector 202. The difference between the sequence x generated by Viterbi detector and the correct sequence d is the error sequence $\{e^{(k)}\}$. A sequence of finite length may be considered mathematically as a vector. The error sequence $\{e^{(k)}\}$ as a vector comprises zeros in almost all vector (element) positions except in those positions containing the bit decisions that are in error. These vectors are also termed Euclidean distance error events because Viterbi detector 202 uses Euclidean distance as a decision metric. A list (or set) of error events is denoted as E, and the list of error events consists of I vectors, I a positive integer. The error event index i, $0 \leq i \leq 1$, within the error event list identifies the error event type. For convenience, the type of error event is also the value of the index i (i.e., "i" is also the label for error type i of list E).

EELC 203 receives 1) the sequence x, 2) the (equalized) samples r, and 3) the list E of error events. With these input values, EELC 203 generates a vector $\lambda$ of error event likelihood values corresponding to each error event type in the list E. Vector $\lambda$ is also termed vector of "error event likelihoods" or "lambda values". The vector $\lambda$ consists of I values, or elements, $\lambda_i$, where as before I is an integer number of error event types in list E. Each value $\lambda_i$ is calculated as the minus-log-likelihood of an error event being of type i. The method of calculating lambda values is described in U.S. patent application to the present inventors filed on Jul. 7, 2000, U.S. Pat. No. 6,630,304, entitled "A METHOD AND APPARATUS FOR EXTRACTING RELIABILITY INFORMATION FROM PARTIAL RESPONSE CHANNELS" incorporated herein in its entirety by reference. Data from EELC 203 are organized into blocks, each block of length N, with error event likelihoods generated for each type within the list E for each codeword. In general, variables are transferred between functional blocks on a block by block (code block by code block) basis.

EEL to BL converter 204 converts the error event likelihoods $\lambda$ generated by EELC 203 into bit likelihood values, represented as a vector $\mu=\{\mu^{(k)}\}$. Each bit-likelihood value in the vector $\mu$ is a measure of the probability that a given decision for a bit is correct. After converting error-event likelihoods to bit likelihoods, the bit likelihoods $\mu$ are used during an iteration of the decoding process applied to decisions x by iterative decoder 104 to generate output â corresponding to the decoded data.

After an iteration of decoding, iterative decoder 104 re-calculates the bit reliabilities $\mu'$ (termed the updated bit reliabilities) from the original bit reliabilities $\mu$ using the decoded data bits of â. For the first iteration (l=0), EEL to BL converter 204 employs the error event likelihoods from EELC 203, but for subsequent iterations (l>0) EEL to BL converter 204 employs updated error event likelihoods from MAPM module 205. The updated error event likelihoods are denoted herein as $\lambda'$.

MAPM module 205 uses the re-calculated bit reliabilities $\mu'$ from iterative decoder 104 to generate updated error event likelihoods $\lambda'$. Other embodiments of MAPM module 205 may also use the decisions â for the decoded data to generate updated error event likelihoods $\lambda'$. Thus, iteratively updating the error event likelihoods $\lambda$ to $\lambda'$ improves the re-calculated bit reliabilities $\mu'$ in iterative fashion. The methods are now described for i) calculating error event likelihoods by EELC 203, ii) converting the error event likelihoods from EELC 203 or MAPM module 205 into bit likelihood values by EEL to BL 204, and iii) using the updated bit reliabilities to generate updated error event likelihoods by MAPM module 205.

As an aid to understanding the present invention, a list of variables for the following description of error event likelihood calculation is summarized and given in Table 1:

TABLE 1

| Variable | Definition |
|---|---|
| $L_h$ | Order of partial response polynomial |
| h | Vector of partial response coefficients |
| L | Length of the longest error event |
| x | Sequence of Viterbi bits |
| r | Sequence of equalized samples |
| v | $(2x - 1) * h$ |
| f | $r - v$ |
| X | Vector of L most recent samples of x |
| E | Error event vector of length L (ending with nonzero) supported by X |
| $\Delta$ | $2 E * h$ |
| Y | Vector of $L + L_h$ most recent samples of v |
| Z | $Y - \Delta = (2(X - E) - 1) * h$ |
| R | Vector of $L + L_h$ most recent samples of r |
| F | Vector of $L + L_h$ most recent samples of f |
| $\mu$ | $(\mu_j)_{1 \leq j \leq L} = \log_e (P(X)/1 - P(X)))$ |
| $\sigma^2$ | Noise variance |

For the variables used herein for the following described embodiments, the notation reserves all superscripts for discrete time, and subscripts denote vector positions.

Error event likelihood calculation by EELC 203 may be as follows. Both data values and Viterbi output decisions are generally considered to be unipolar valued for binary data transmission (i.e., $d^{(k)}$ and $x^{(k)} \in \{0,1\}$). As above, E denotes the list (or set) of I dominant minimum distance error event sequences. Thus the list $E=\{\epsilon_i : 1 \leq i \leq I\}$, where each $\epsilon_i$ is a vector of length $L_i$, and the minimum distance error event sequence of type i is $\epsilon_i=(\epsilon_{i,j})_{1 \leq j \leq L}, \epsilon_{i,j} \in \{-1,0,+1\}$. The maximal error event length is denoted L, and j is a variable used to denote the position of the $j^{th}$ element $\epsilon_{i,j}$ in the vector $\epsilon_i$.

Two vectors are formed, denoted by $X=(X_j)_{1 \leq j \leq L}$ and $R=(R_j)_{1 \leq j \leq +Lh}$, that are vectors containing the most recent values for sequences x and r at (discrete) time k as defined in equations (2) and (3):

$$X_j = x^{(k-L+j)}, 1 \leq j \leq L \qquad (2)$$

$$R_j = r^{(k-L+j)}, 1 \leq j \leq L+L_h. \qquad (3)$$

The vectors X and R contain both i) L past samples and ii) $L_h$ future samples to account for channel memory having length $L_h$ ($L_h$ is the order of the PR polynomial for the PR channel). For a given implementation, "future" samples are available since buffering may allow these future samples to be present in the system, and thus available to the algorithm, when processing the current bit of interest.

To simplify indexing, ends of all error event vectors are aligned. Alignment may be accomplished by denoting $E_i$ as a vector of length L with the last $L_i$ components equal to the components of the vector $\epsilon_i$ in list E and all other components equal to zero (i.e., $E_i=(O_{le}, \epsilon_i)$. The vector $O_{le}$ is a vector of zeros having length equivalent to the difference between L and $L_i$. Similarly, $E_x$ denotes the set of error vectors $E_i$ that are supported by vector X, i.e., sequences $\epsilon_i$ for which $X - E_i \in \{0, 1\}^L$. If the vector X is incorrect, corresponding to an incorrect sequence of decisions from Viterbi detector 202, then with high probability the correct sequence is from the set $\{X-E_i : E_i \in E_x\}$.

The particular error event sequence that causes the vector X to be incorrect is denoted $\epsilon_{i^*}$. The error type (value) $i^*$, $1 \leq i^* \leq I$, is the error event causing Viterbi detector 202 to generate the incorrect sequence at time k. Using the definition of MSLD detection, if the output decision vector X of Viterbi detector 202 is not correct, but the correct vector is $C, C=X-E_{i^*}$, then for every $i \neq i^*$ the double inequality of equation (4) is satisfied:

$$p(R|X) \geq p(R|C), \qquad (4)$$

where $p( )$ denotes probability density function, and $p(\alpha|\beta)$ is the probability density function of $\alpha$ given $\beta$. Under AWGN conditions, the expression for $p(n)$ is $p(n)=(1/\sqrt{2\pi\sigma^2}) \exp(-n^2/2\sigma^2)$, where $\sigma^2$ is the variance of the noise n, and the previous relation of equation (4) may then be as given in equation (5):

$$|Y-R|^2 \leq |Z-R|^2. \qquad (5)$$

In equation (5), the symbol $|A|^2$ denotes the square of vector A (sum of squares of elements of A); and vectors Y and Z are ideal channel output vectors X and C (with C being and $X-E_{i^*}$, $i \neq i^*$). Ideal channel output vectors X and C may be generated by convolving the vector with the partial response polynomial h(D). For example, the filtered version of X is the vector Y as expressed in equation (6):

$$Y = \left( \sum_{j=1}^{L_h} h_j(2X_{i+1-j} - 1) \right)_{1 \leq i \leq L+L_h} \qquad (6)$$

An expression for the vector Z may be generated similarly.

The quantity $(p(R|X)-p(R|C))$ represents a level of reliability for the decision that the sequence X is correct. Under AWGN conditions, EELC 203 calculates the $L_2$ norms, and so this quantity may be expressed as an error event likelihood $\lambda_C$. The likelihood $\lambda_C$ is defined as the logarithm of the ratio of i) the likelihood of Viterbi vector $X^{(k)}$ to ii) the likelihood of vector $C=X-E_{i^*}$. When simplified, likelihood $\lambda_{XE}$ may be as in equation (7):

$$\lambda_C = |Z-R|^2 - |Y-R|^2. \qquad (7)$$

The likelihood $\lambda_C$ may also be referred to as an error event likelihood or error event lambda value.

From the definition of the vector C, the likelihood value $\lambda_C$ is also related to the likelihood of error event $E_{i^*}$. As $\lambda_C$ gets smaller, this indicates that it is more likely that the error event of type $i^*$ has occurred that gives rise to $C=X-E_{i^*}$. To simplify the expression $\lambda_C$ for calculation of error event likelihoods, the vector F is formed that is a vector of most recent samples of sequence f, where $f=r-v=(r -(2x-1)*h(D))$. When calculating a value for a given position j in the output sequence, the vector $F_j$ is expressed as given in equation (8):

$$F_j = f^{(k-L+j)}, 1 \leq j \leq L+L_h. \qquad (8)$$

Using equation (8), defining $\Delta_{i^*}$ as Y-Z, and with F equivalent to R-Y, equation (7) is rewritten as equation (7'):

$$\lambda_C = (\Delta_{i^*}+F) \cdot (\Delta_{i^*}+F)^T - F \cdot F^T \qquad (7')$$

which yields the expression for $\lambda_C$ as given in equation (9):

$$\lambda_C = 2\Delta_{i^*} \cdot F^T + \Delta_{i^*} \cdot \Delta_{i^*}^T \qquad (9)$$

In equation (9), the quantity $\Delta_{i*}$ previously defined as Y−Z is also substantially equivalent to $\Delta_{i*}=2E_{i*}*h(D)$. The first part of the expression $(2\Delta_{i*}F^T)$ is a correlation between i) the filtered vector of error event i* and ii) the difference between received signal and filtered Viterbi output. The second part of the expression $(\Delta_{i*}\Delta_{i*}{}^T)$ is the energy of the filtered vector of error event i*.

Thus, for each possible error event $E_i$ at time k, $1 \leq i \leq I$, an error event likelihood (or lambda value) $\lambda_i$ may be calculated for it as in equation (10):

$$\lambda_i = 2\Gamma_i + \Psi_i \tag{10}$$

where $\Gamma_i = \Delta_i F^T$ and $\Psi_i = \Delta_i \Delta_i^T$. As discussed above, a smaller value of $\lambda_i$ indicates that it is more likely that error event $E_i$ occurred. Filtered versions of error events from a given list E, as well as their corresponding energies are time invariant and may be pre-calculated and stored for use by EELC 203. Although the expression of correlation $\Gamma_i$ is written in vector form, it may be converted into a scalar value using the definition of inner product. The inner product of vectors may be calculated serially by multiplying the vector elements and adding the results, and, for the preferred embodiment, serial operations on samples f=r−v are performed.

Figure 3:
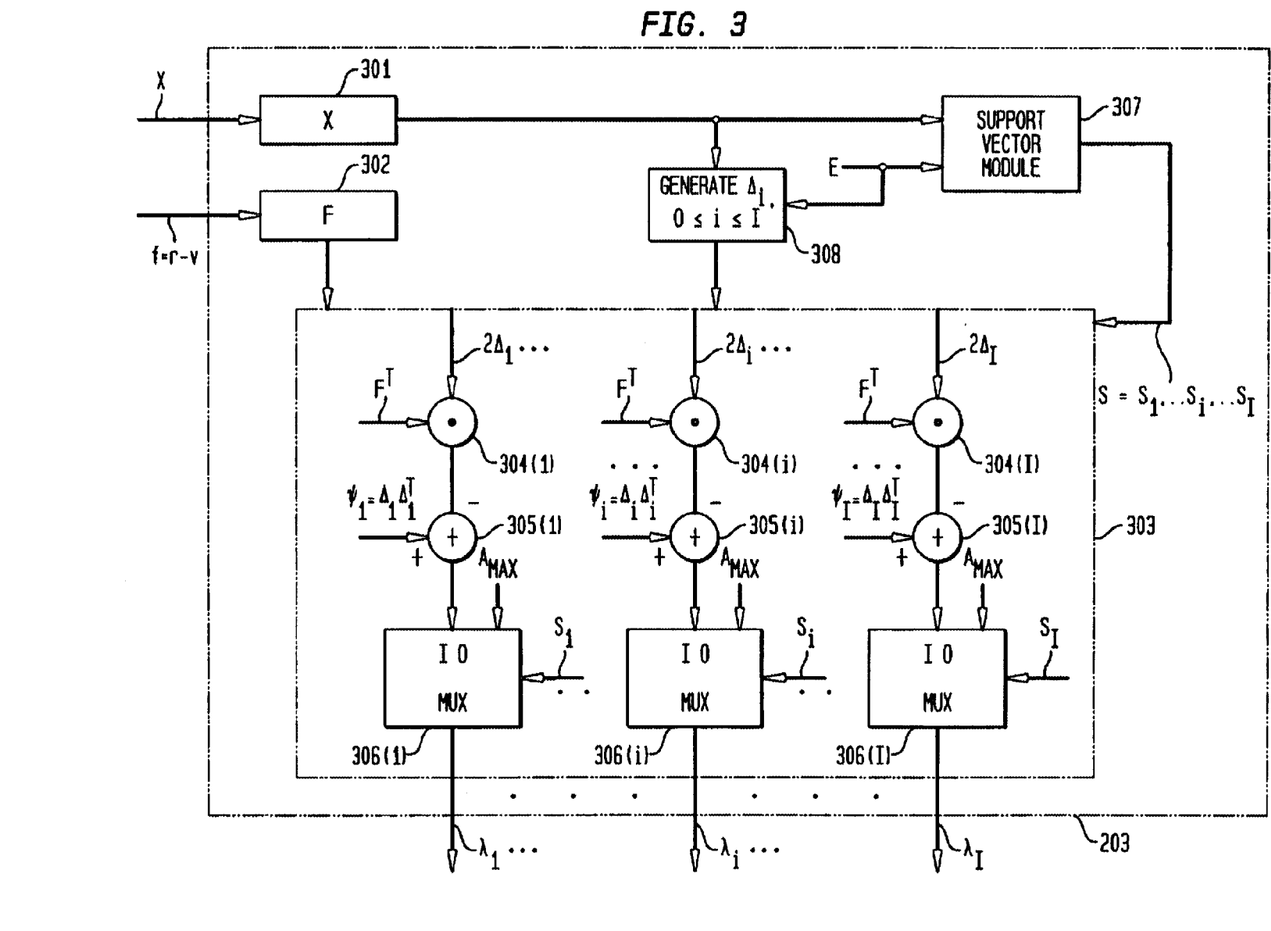
FIG. 3 is a block diagram for an exemplary implementation of the error event likelihood calculator as shown in FIG. 2.

FIG. 3 is a block diagram of an exemplary implementation of EELC 203 as shown in FIG. 2. At each time instant k, the values input to EECL 203 are i) a vector $X^{(k)}$ (stored in register 301) of the decision sequence x, and ii) a corresponding vector $F^{(k)}$ (stored in register 302) of the sequence f formed from the received (equalized) sample sequence r and v which is formed from the decisions x and the channel polynomial h. EECL 203 generates the error event likelihoods $\lambda_i$, $1 \leq i \leq I$, for the vector $X^{(k)}$. EECL 203 comprises a set 303 of I substantially identical branches calculating $\lambda_i$, $1 \leq i \leq I$. An $i^{th}$ branch of set 303 comprises multiplier 304(i), combiner 305(i), and multiplexer (mux) 306(i). EELC 203 further comprises support vector module 307 that generates a support vector $s=(s_1, \ldots, s_I)$ based on i) the input vector $X^{(k)}$ and ii) error event vectors $(E_1, \ldots, E_I)$. Each element $s_i$ of a support vector s is equal to 1 if the vector $X^{(k)}$ of Viterbi detector 202 supports the error event of type i (i.e., if $X^{(k)} - E_i \in \{-1, 0, +1\}$); otherwise, element $s_i$ is equal to 0. Module 308 calculates the quantities $\Delta_i$ as defined above for calculations of corresponding branches in set 303.

The correlation $2\Gamma_i$, $1 \leq i \leq I$, is generated by multiplying $2\Delta_i$ and $F^T$ in the corresponding $i^{th}$ branch multiplier 304(i). The correlation $2\Gamma_i$ is subtracted from the corresponding energy $\Psi_i$ in the corresponding $i^{th}$ branch combiner 305(i). The output of $i^{th}$ branch mux 306(i) is controlled by the $i^{th}$ support element $s_i$. If $s_i=1$, the output of mux 306(i) is $2\Gamma_i + \Psi_i$, otherwise the output of mux (i) is set to a relatively large constant $A_{max}$. The output of mux 306(i) is set to a relatively large constant $A_{max}$ since a larger resulting value for $\lambda_i$ indicates that it is less likely that the error event $E_i$ occurred (i.e., the element $s_i$ of the support vector s indicates that it is relatively unlikely that the corresponding error event $E_i$ occurred).

Conversion from error event likelihood values to bit likelihood values (termed bit reliabilities $\mu$), by EEL to BL converter 204 may be implemented as follows. At each time k, the likelihood $\lambda_i$ of error event $E_i$ is calculated as described with respect to FIG. 3, with smaller $\lambda_i$ indicating that it is more likely that error event $E_i$ occurred. A register (not shown) is maintained for storing the current block $\Lambda$ of error event likelihoods $\lambda$ for the last L bits and current block M of bit reliabilities $\mu$.

The vector $\lambda^{(K)}$ is defined as the vector of all error event likelihoods that are supported by $X^{(K)}$ (i.e. the likelihoods of error vectors $E_i^{(K)}$, and the vector $\Lambda^{(K)}$ is defined as a vector of error event likelihoods for the last L bits at time k. The vector $\Lambda^K$ has elements defined by $\Lambda^K = (\Lambda_j^K)_{1 \leq j \leq L} = (\lambda^{(k-L+j)})$ at position j, $1 \leq j \leq L$. The most likely error event type at (discrete) time k is $i^k$. Given these quantities stored in the register, a processor implements an update rule as given in the following pseudo-code:

```
100       Shift vector X^(k-1):
101           X^k_j = X^(k-1)_{j+1}, 1≤j≤L-1
102           X^k_L = x^(k)
103       Shift vector Λ^(k-1):
104           Λ^k_j = Λ^(k-1)_{j+1}, 1≤j≤L-1
105           Λ^k_j = λ^(k)
106       Update vector Λ^k:
107       for E_i ∈ E^(k)
108           for L-L_i^h +1≤j≤L-1
109               if E_i^k_j ≠0
110                   if |Λ^k_j| > λ^k_i_k
111                       Λ^k_j = λ^k_i_k
112                   endif
113               endif
114           end
115       end
116       Generate output:
117       μ^(k-L) = Λ^k_1(-1)^{X^k_1}
118       Return
```

The pseudo-code comprises two loops. One loop finds, for each position j, a minimum likelihood over all likelihoods for all supported error events with $E_{i^k,j} \neq 0$, and the other loop compares this minimum likelihood value with element $\Lambda^k_j$ at position j. The output bit reliability vector at time k is $\mu^{(K-L)}$ and the element's sign is determined by the corresponding values of $X^{(K)}$. Note that bit reliabilities are generated with a delay equal to the length of the longest error event. The pseudo-code may be employed for conversion of error-event likelihoods into bit reliabilities regardless of whether the error-event likelihood values are generated by EELC 203 for the first iteration of decoding by iterative decoder 104, or the updated error-event likelihoods from MAPM module 205 for subsequent iterations of decoding. As would be apparent to one skilled in the art, the operations of the pseudo-code may be implemented in hardware or as steps in software implemented with a processor.

The method of updating bit reliabilities for the decoded data from iterative decoder 104 and then converting the updated bit reliabilities to new error event likelihoods by MAPM module 205 may be as follows. If MAP detection is used under AWGN conditions, then the error event likelihood $\lambda_C$ of equation (11) may be as given in equation (11):

$$\lambda_C = 2 \cdot \Gamma + \Psi + 2\sigma^2 \log_e \frac{P(X)}{P(X-E)} \tag{11}$$

where, as described previously, $\Gamma = \Delta F^T$ and $\Psi = \Delta \Delta^T$ and P(X) is a priori probability of the vector X. If the bits of X are independent, equation (11) may be rewritten as in equation (12):

$$\lambda_C = 2\Gamma + \Psi + 2\sigma^2 \sum_{\substack{j=1 \\ E_j \neq 0}}^{L} \mu_j \tag{12}$$

where $\mu$ is a vector of bit-reliabilities of L most recent bits (i.e., $\mu = \{\mu_j\}$, $1 \leq j \leq L$).

The first two terms of equation (12) of the expression for $\lambda_C$ form the original error event likelihood (from equation (10) that is subsequently converted to a bit reliability for iterative decoder 104). The third (rightmost) term of equation (12) represents an increase in decoding confidence that may be used to update the error event likelihoods, and thus improve the bit reliabilities, used by iterative decoder 104 in the subsequent iteration. Thus, each of the error event likelihoods $\lambda_i$ may be updated to $\lambda_i'$ using the relation of equation (12). Specifically, the error event likelihoods $\lambda_i$ may be updated to $\lambda_i'$ using a combination of the bit reliabilities for the bit estimates at the positions related to the non-zero error event vector $E_i$. The following describes various aspects of calculating the combination.

For the first iteration of decoding by iterative decoder 104, little or no information about error event likelihoods is available. Consequently, in the preferred embodiment, the elements of the vector $\mu$ are initially set to zero. Thus, for the first iteration, the last (rightmost) term in equation (12) goes to zero. However, after the first iteration, iterative decoder 104 generates updated bit reliabilities $\mu'$ from the input bit reliabilities $\mu$ based on the decoding process (using the relationships between bits from the error correction encoding scheme). The updated bit reliabilities $\mu'$ that are generated by iterative decoder 104 may also then be subsequently improved when using updated error event likelihoods generated in accordance with exemplary methods of the present invention before the next iteration of decoding. The updated bit reliabilities $\mu'$ s may be improved by increasing those bit reliabilities that tend to show increasing confidence for corresponding decoded bits (i.e., corresponding to decoding of the decision sequence x of Viterbi detector 202) between iterations, while decreasing those reliabilities that tend to show decreasing confidence for corresponding decoded bits. Such improvements tend to drive the iterative decoding scheme to fewer iterations while maintaining a predetermined probability of error. Thus, error event likelihoods $\lambda_C$ may be re-calculated prior to input to EEL to BL converter 204 to reflect this confidence from the iterative decoding process.

The magnitude of the bit reliability for the $j^{th}$ bit in X, denoted $X_j$, is calculated as the smallest value of error event likelihood $\lambda_C$ over all of the supported error events and in all positions covering the position of element $X_j$. This calculation may be expressed mathematically as in equation (13):

$$|\mu_j| = \min_E \lambda_C \quad (13)$$

where $|\bullet|$ indicates the magnitude of "$\bullet$". The sign of $\mu_j$ is determined by $X_j$.

If bits are transmitted using BPSK modulation, the sign of $\mu_j$ equals $(-1)^{x_j}$ (i.e., the bit likelihoods with positive sign correspond to a zero-valued Viterbi-detected data bit at position j). If iterative decoder 104 has generated updated bit reliabilities $\mu'_j$ for the $j^{th}$ position, the third (rightmost) term of equation (12) may be modified as in equation (14):

$$2\sigma^2 \sum_{\substack{j=1 \\ E_j \neq 0}}^{L} \mu_j = 2\sigma^2 \sum_{\substack{j=1 \\ E_j \neq 0}}^{L} (-1)^{X_j} \mu'_j \quad (14)$$

where $2\sigma^2$ represents the noise power of the channel, which may be estimated and/or measured and stored as a constant.

The first two terms in equation (12) remain unmodified, and so need not be re-calculated. As shown in equation (13), $\mu_C$ increases whenever the bit produced by Viterbi detector 202 and the sign of the corresponding bit likelihood generated by iterative decoder 104 agree. Conversely, $\mu_C$ decreases when they disagree. Table 2 summarizes the bit reliability contributions to equation (13). For example, during an iteration of decoding, a decision $X_j$ is set to 0 with bit reliability $\mu_j$ of, say, +10. This condition indicates that iterative decoder 104 interprets the bit $X_j$ as 0 with a high level of confidence, and that the magnitude of the bit reliability of this bit should be increased before the next iteration (to reduce the likelihood of the corresponding error event).

TABLE 2

|  | sign($\mu'_j$) = +1 | sign($\mu'_j$) = −1 |
|---|---|---|
| $X_j = 0$ | $|\mu'_j|$ | $-|\mu'_j|$ |
| $X_j = 1$ | $-|\mu'_j|$ | $|\mu'_j|$ |

When $\mu_C$ is calculated for the first iteration, the value of $\mu_C$ is positive, and the sign of the corresponding bit likelihood is determined using X. When $\mu_C$ in some subsequent iteration becomes negative valued, the value of $\mu_C$ is still used to calculate bit likelihoods, but with the following adjustment. The absolute value of the likelihood $\mu_C$ is employed for the minimization of equation (13), but the sign of the bit reliability is inverted, as shown in equation (15):

$$\mu_j = \lambda^*_C * (-1)^{X_j} \quad (15)$$

where $\lambda^*_C$ is the likelihood with smallest magnitude satisfying equation (16):

$$|\lambda^*_C| = \min_E |\lambda_C| \quad (16)$$

Figure 4:
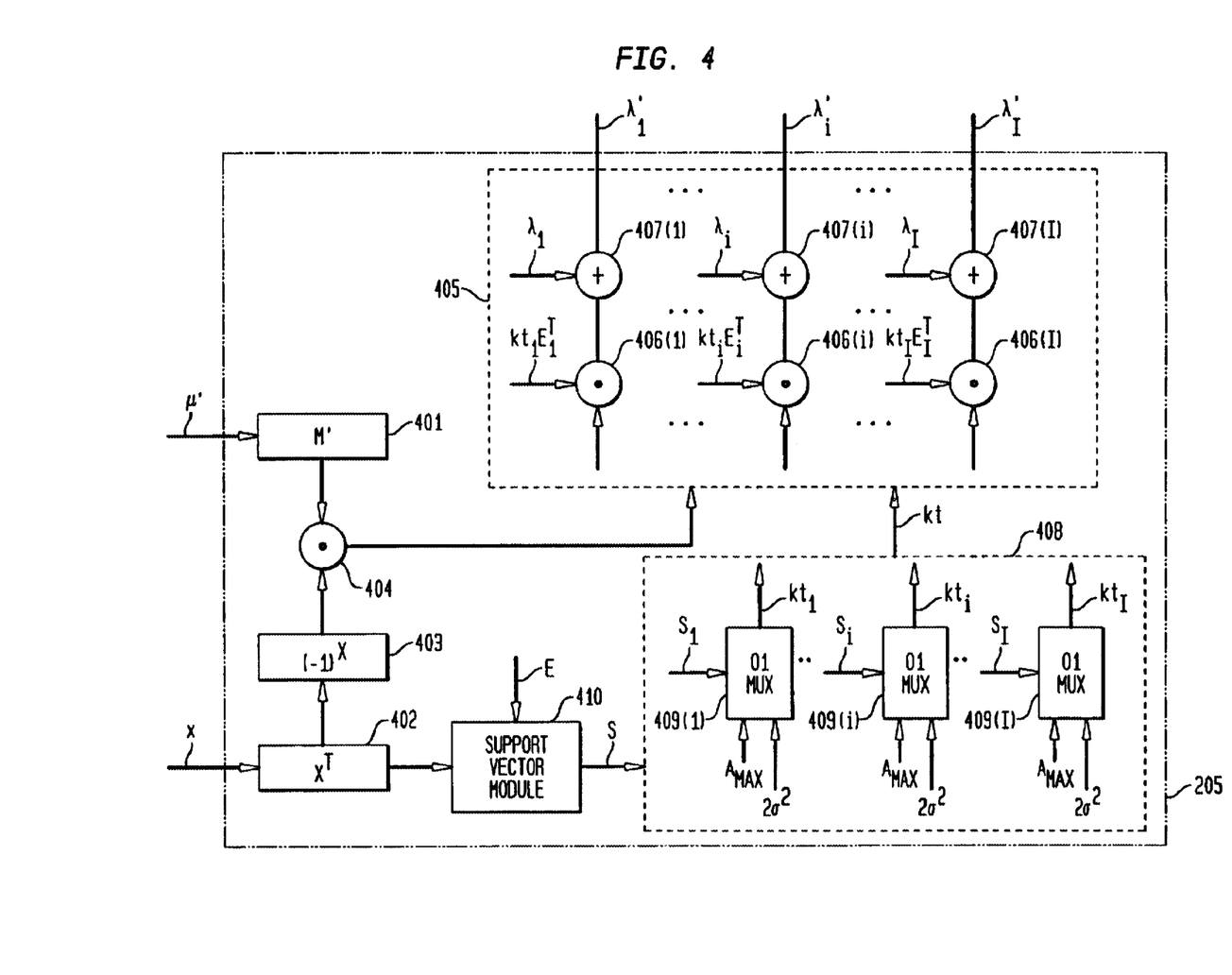
FIG. 4 is a block diagram for an exemplary implementation of the maximum a posteriori modification module as shown in FIG. 2.

FIG. 4 is a block diagram of an exemplary implementation of MAPM module 205 as shown in FIG. 2. Register 401 receives the vector M' of updated bit reliabilities $\mu'$ from iterative decoder 104 and register 402 receiving the vector X of Viterbi decision sequence x. The vector X is used by support vector module 410, along with the set of error events E, to generate support vector s in a similar manner to that described for support vector module 307 of FIG. 3. Each element $s_i$ of the support vector s is applied to a corresponding mux 409(i) to select either $A_{max}$ or $2\sigma^2$ as an output constant $kt_i$. The output constant $kt_i$ is used to either update the error event $\lambda_i$ to $\lambda'_i$ or to set the error event to a high value to indicate substantially high confidence in the corresponding decoded bit.

Module 403 computes the sign of the bit reliability, and the value of equation (14) is then computed via combination (inner product) in multiplier 404 of the vector M' s of updated bit reliabilities $\mu'$ with the output of module 403. The output of multiplier 404 is applied to each branch of the set 405 of 1 branches. The $i^{th}$ branch calculates a corresponding one of the updated error-event likelihoods $\lambda'_i$, where $0 \leq i \leq I$, and the $i^{th}$ branch comprises multiplier 406(i) and adder 407(i). The $i^{th}$ branch multiplier 406(i) multiplies the output of combiner 404 with the $i^{th}$ error event vector $E_I$ and the corresponding constant $kt_i$. When $kt_I$ is not $A_{MAX}$, the output of multiplier 406(i) will be zero if all elements of the error event vector $E_I$ is all zero. Otherwise, the output of multiplier 406(i) will be a measure of the noise energy. The output of the $i^{th}$ branch multiplier 406(i) is then added to the current error event likelihood $\lambda_i$ in the $i^{th}$ branch adder 407(i) to generate the updated error event likelihood $\lambda'_i$.

While the exemplary embodiments of the present invention have been described with respect to systems, as would be apparent to one skilled in the art, the various functions of system blocks or elements may be implemented in hardware (e.g., circuits) or in the digital domain as processing steps in a software program. Such software may be employed in, for example, a digital signal processor, micro-controller or general purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage i:medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A method of iteratively decoding a sample sequence representing encoded data and filtered by a channel polynomial, the method comprising the steps of:
   (a) generating bit estimates for the sample sequence corresponding to the encoded data;
   (b) extracting error event likelihoods for the bit estimates based on i) the sample sequence, ii) the bit estimates, and iii) an error event list;
   (c) decoding, during a first iteration, the bit estimates by the steps of:
      (1) converting the error event likelihoods into bit reliabilities,
      (2) decoding the bit estimates into decoded data based on the bit reliabilities,
      (3) updating the bit reliabilities based on the decoded data; and
   (d) decoding, during a subsequent iteration, the bit estimates by the steps of:
      (1) updating the error event likelihoods based on the updated bit reliabilities;
      (2) converting the updated error event likelihoods to new bit reliabilities, and
      (3) decoding the bit estimates into newly decoded data based on the new bit reliabilities.

2. The invention as recited in claim 1, wherein step (a) generates the bit estimates based on a maximum likelihood detection algorithm for a partial response channel.

3. The invention as recited in claim 2, wherein step (d1) updates the error event likelihoods by adding to each of the error event likelihoods a combination of the updated bit reliabilities.

4. The invention as recited in claim 2, wherein the combination of bit reliabilities includes the bit reliabilities for all bit estimates that contribute to an error event of the error event list for the bit estimate corresponding to the error event likelihood.

5. The invention as recited in claim 4, wherein the sign of each bit reliability of the combination is determined by the corresponding bit estimate.

6. The invention as recited in claim 4, wherein, for encoded data transmitted with binary phase shift key modulation, the combination of updated bit reliabilities added to each error event likelihood $\lambda_C$ corresponding to a bit at a given position j in the bit estimates is:

$$\lambda'_C = \lambda_C + 2\sigma^2 \sum_{\substack{j=1 \\ E_j \neq 0}}^{L} (-1)^{X_j} \mu'_j$$

where $\lambda_C'$ is the updated error event likelihood, $E_j$ is the error event vector of the error event list, $X_j$ is the bit estimate at position j, and $\mu_j'$ is the updated bit reliability for the bit estimate at position j.

7. The invention as recited in claim 1, wherein step (b) extracts each error event likelihood by the steps of:
   (b1) calculating a correlation between i) an error event vector of the error event list that corresponds to the error event likelihood and ii) a difference between the sample sequence and the bit estimates filtered by the channel polynomial;
   (b2) calculating an energy of the error event vector filtered by the channel polynomial; and
   (b3) combining the correlation and the energy to form the error event likelihood.

8. The invention as recited in claim 1, wherein steps (c1) and (d2) convert the error event likelihoods into a bit reliability for each of the bit estimates by the steps of:
   (i) finding the minimum error event likelihood for the bit estimates over all error event likelihoods and in all corresponding to those error events in the error event list supported by the bit estimates;
   ii) setting the magnitude of the bit reliability based on the minimum error event likelihood and the sign of the bit reliability based on the corresponding bit estimate.

9. The invention as recited in claim 1, further comprising the step of receiving the sample sequence from a partial response (PR) channel.

10. The invention as recited in claim 9, wherein the PR channel is either an optical recording media, magnetic recording media, optical communication channel, or wireless communication channel.

11. The invention as recited in claim 1, wherein the method is implemented by a processor in an integrated circuit.

12. Apparatus for decoding a sample sequence representing encoded data and filtered by a channel polynomial, the apparatus comprising:
   a detector generating bit estimates for the sample sequence corresponding to the encoded data;
   an error event likelihood calculator (EELC) extracting error event likelihoods for the bit estimates based on i) the sample sequence, ii) the bit estimates, and iii) an error event list;
   a error event likelihood to bit likelihood (EEL to BL) converter that generates a bit reliability for each bit estimate based on error event likelihoods;
   an iterative decoder that iteratively decodes the bit estimates based on a mapping used to generate the encoded data and the bit reliability for each bit; and a maximum a posteriori modification (MAPM) module that updates each error event likelihood after an iteration of decoding by the iterative decoder, wherein, during a first iteration:
the EEL to BL converter converts the error event likelihoods from the EELC into bit reliabilities for the first iteration,
the iterative decoder decodes the bit estimates into decoded data based on the bit reliabilities of the first iteration and updates the bit reliabilities of the first iteration based on the decoded data; and wherein, during a subsequent iteration:
the MAPM module updates the error event likelihoods based on the updated bit reliabilities;
the EEL to BL converter converts the updated error event likelihoods to new bit reliabilities, and
the iterative decoder decodes the bit estimates into newly decoded data based on the new bit reliabilities.

13. The invention as recited in claim 12, wherein the detector is a maximum likelihood sequence detector generating the bit estimates based on a maximum likelihood detection algorithm for a partial response channel.

14. The invention as recited in claim 13, wherein the MAPM module updates the error event likelihoods by adding to each of the error event likelihoods a combination of the updated bit reliabilities.

15. The invention as recited in claim 13, wherein the combination of bit reliabilities includes the bit reliabilities for all bit estimates that contribute to an error event of the error event list for the bit estimate corresponding to the error event likelihood.

16. The invention as recited in claim 15, wherein the sign of each bit reliability of the combination is determined by the corresponding bit estimate.

17. The invention as recited in claim 15, wherein, for encoded data transmitted with binary phase shift key modulation, the combination of updated bit reliabilities added to each error event likelihood $\lambda_C$ corresponding to a bit at a given position j in the bit estimates is:

$$\lambda_C' = \lambda_C + 2\sigma^2 \sum_{\substack{j=1 \\ E_j \neq 0}}^{L} (-1)^{X_j} \mu_j'$$

where $\lambda_C'$ is the updated error event likelihood, $E_j$ is the error event vector of the error event list, $X_j$ is the bit estimate at position j, and $\mu_j'$ is the updated bit reliability for the bit estimate at position j.

18. The invention as recited in claim 12, wherein the EELC generates each error event likelihood by:
(i) calculating a correlation between i) an error event vector of the error event list that corresponds to the error event likelihood and ii) a difference between the sample sequence and the bit estimates filtered by the channel polynomial;
(ii) calculating an energy of the error event vector filtered by the channel polynomial; and
(iii) combining the correlation and the energy to form the error event likelihood.

19. The invention as recited in claim 12, wherein EEL to BL converter forms the error event likelihoods into a bit reliability for each of the bit estimates by:
(i) finding the minimum error event likelihood for the bit estimates over all error event likelihoods and in all corresponding to those error events in the error event list supported by the bit estimates;
(ii) setting the magnitude of the bit reliability based on the minimum error event likelihood and the sign of the bit reliability based on the corresponding bit estimate.

20. The invention as recited in claim 12, wherein the sample sequence is a sampled signal received from a partial response (PR) channel.

21. The invention as recited in claim 20, wherein the PR channel is either an optical recording media, magnetic recording media, optical communication channel, or wireless communication channel.

22. The invention as recited in claim 12, wherein the apparatus is implemented as a circuit.

23. The invention as recited in claim 12, wherein the circuit is implemented in an integrated circuit.

24. A computer-readable medium having stored thereon a plurality of instructions, the plurality of instructions including instructions which, when executed by a processor, cause the processor to implement a method for iteratively decoding a sample sequence representing encoded data and filtered by a channel polynomial, the method comprising the steps of:
(a) generating bit estimates for the sample sequence corresponding to the encoded data;
(b) extracting error event likelihoods for the bit estimates based on i) the sample sequence, ii) the bit estimates, and iii) an error event list;
(c) decoding, during a first iteration, the bit estimates by the steps of:
(1) converting the error event likelihoods into bit reliabilities,
(2) decoding the bit estimates into decoded data based on the bit reliabilities,
(3) updating the bit reliabilities based on the decoded data; and
(d) decoding, during a subsequent iteration, the bit estimates by the steps of:
(1) updating the error event likelihoods based on the updated bit reliabilities;
(2) converting the updated error event likelihoods to new bit reliabilities, and
(3) decoding the bit estimates into newly decoded data based on the new bit reliabilities.

* * * * *